US011757034B2

(12) United States Patent
Wang et al.

(10) Patent No.: US 11,757,034 B2
(45) Date of Patent: Sep. 12, 2023

(54) HIGH VOLTAGE DEVICE (71) Applicant: TAIWAN SEMICONDUCTOR MANUFACTURING COMPANY LTD., Hsinchu (TW)

(72) Inventors: Hung-Sen Wang, Tainan (TW); Yun-Ta Tsai, Hsinchu (TW); Ruey-Hsin Liu, Hsinchu (TW); Shih-Fen Huang, Hsinchu County (TW); Ho-Chun Liou, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 17/731,159

(22) Filed: Apr. 27, 2022

(65) Prior Publication Data
US 2022/0254923 A1    Aug. 11, 2022

Related U.S. Application Data (62) Division of application No. 16/906,894, filed on Jun. 19, 2020, now Pat. No. 11,322,609.
(Continued)

(51) Int. Cl.
*H01L 29/78* (2006.01)
*H01L 27/06* (2006.01)
(Continued)

(52) U.S. Cl.
CPC ...... *H01L 29/7816* (2013.01); *H01L 27/0617* (2013.01); *H01L 29/0653* (2013.01); *H01L 29/42356* (2013.01); *H01L 29/66681* (2013.01)

(58) Field of Classification Search
CPC ............. H01L 29/7816; H01L 29/0653; H01L 29/42356; H01L 29/66681; H01L 29/063;
(Continued)

(56) References Cited

U.S. PATENT DOCUMENTS

4,980,743 A * 12/1990 Nakagawa .......... H01L 29/7455
257/E29.037
9,698,246 B1 * 7/2017 Edwards ............... H01L 29/167
(Continued)

*Primary Examiner* — Galina G Yushina
(74) *Attorney, Agent, or Firm* — WPAT LAW; Anthony King (57) ABSTRACT A high-voltage device includes a first frame-like isolation and a second frame-like isolation separated from each other, a first frame-like gate structure covering the first frame-like isolation, a second frame-like gate structure covering the second frame-like isolation, a first drain region enclosed by the first frame-like isolation, a second drain region enclosed by the second frame-like isolation, a first frame-like source region surrounding the first frame-like gate structure, a second frame-like source region surrounding the second frame-like gate structure, a first doped region surrounding the first and second frame-like gate structures, and a second doped region disposed between the first and second frame-like gate structures. The first and second drain regions, and the first and second frame-like source regions include a first conductivity type. The first and the second doped region include a second conductivity type. The first conductivity type and the second conductivity type are complementary to each other.

20 Claims, 4 Drawing Sheets

Related U.S. Application Data

(60) Provisional application No. 62/942,049, filed on Nov. 29, 2019.

(51) Int. Cl.
*H01L 29/06* (2006.01)
*H01L 29/66* (2006.01)
*H01L 29/423* (2006.01)

(58) Field of Classification Search
CPC ............. H01L 29/0696; H01L 29/0619; H01L 29/1095; H01L 29/7823; H01L 27/0617
See application file for complete search history.

(56) References Cited

U.S. PATENT DOCUMENTS

| | | | |
|---|---|---|---|
| 2002/0050619 A1* | 5/2002 | Kawaguchi | H01L 29/66659 257/E27.06 |
| 2011/0284956 A1* | 11/2011 | Satou | H01L 29/0847 257/E29.256 |
| 2015/0236149 A1* | 8/2015 | Huang | H01L 29/0692 438/286 |
| 2016/0163583 A1* | 6/2016 | Liu | H01L 29/66681 438/430 |
| 2016/0284801 A1* | 9/2016 | Mori | H01L 29/0653 |

* cited by examiner

HIGH VOLTAGE DEVICE

PRIORITY DATA

This patent is a divisional application of U.S. patent application Ser. No. 16/906,894 filed on Jun. 19, 2020, entitled of "HIGH VOLTAGE DEVICE", which claims the benefit of U.S. Provisional Patent Application Ser. No. 62/942,049 filed Nov. 29, 2019, the entire disclosure of which is hereby incorporated by reference.

BACKGROUND

Technological advances in semiconductor integrated circuit (IC) materials, design, processing, and manufacturing have enabled the continual reduction in size of IC devices, where each generation has smaller and more complex circuits than the previous generation.

As semiconductor circuits composed of devices such as metal-oxide-semiconductor field-effect transistors (MOSFETs) are adapted for high voltage applications, such as high-voltage lateral diffusion metal-oxide-semiconductor (HV LDMOS) devices, problems arise with respect to decreasing voltage performance as the downscaling continues with advanced technologies. To prevent punch-through between source and drain, or to reduce resistance of the source and drain, standard MOS fabrication process flows may be accompanied by multiple implantations of high concentrations. Substantial substrate leakage and voltage breakdown often occur with device reliability degradation.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat references numerals and/or letters in the various examples. This repetition is for the purpose of simplicity and clarity and does not in itself dictate a relationship between the various embodiments and/or configurations discussed.

This description of illustrative embodiments is intended to be read in connection with the accompanying drawings, which are to be considered part of the entire written description. In the description of embodiments disclosed herein, any references to direction or orientation are merely intended for convenience of description and are not intended in any way to limit the scope of the present disclosure. Relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected" refer to a relationship wherein structures are secured or attached to one another either directly or indirectly through intervening structures, as well as both movable or rigid attachments or relationships, unless expressly described otherwise. Moreover, the features and benefits of the disclosure are illustrated by references to the embodiments. Accordingly, the disclosure expressly should not be limited to such embodiments illustrating some possible non-limiting combination of features that may exist alone or in other combinations of features, the scope of the disclosure being defined by the claims appended hereto.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

Typically, it is required that a high-voltage device has low anti-punch capability between the source/body and the substrate. In some comparative approaches, an n-type buried doped layer and a p-type doped region are formed in a high-voltage device, such that the high-voltage device can be fully isolated from the substrate. In other comparative approaches, a width of the n-type buried doped layer can be increased to sustain high voltage during an off-state and high-voltage gap between the source/body and the substrate in the large cell array application. However, a large area penalty will be incurred by such increased width.

Further, breakdown voltage (BVD) and on-resistance (Ron) are two important characteristics of a high-voltage device used in a power switch circuit. Improving the operation of a power switch circuit incorporating MOSFETs suggests using a MOSFET with a breakdown voltage as high as possible and an on-resistance as low as possible. However, in order to improve the anti-punch capability, the large area for adopting the large n-type buried doped layer causes the high-voltage device to suffer from increased on-resistance.

The present disclosure therefore provides a high-voltage device having a frame-like gate structure. The frame-like gate structure helps to reduce current from the drain region through the drift region. Accordingly, breakdown voltage and anti-punch capability of the high-voltage device can be increased. Further, because the frame-like gate helps to improve the anti-punch capability, a width of the n-type doped layer can be reduced, such that on-resistance can be reduced. In other words, the high-voltage device including the frame-like gate structure has an increased breakdown voltage, an improved anti-punch capability, and reduced on-resistance.

In some embodiments, a high-voltage device 100 is provided. The high-voltage device 100 can be an n-type high-voltage device, but the disclosure is not limited thereto. In some embodiments, the high-voltage device 100 can be referred to as a high-voltage laterally-diffused MOS (HV LDMOS) transistor device, a high-voltage extended-drain MOS (HV EDMOS) transistor device, or any other UV device.

Figure 1:
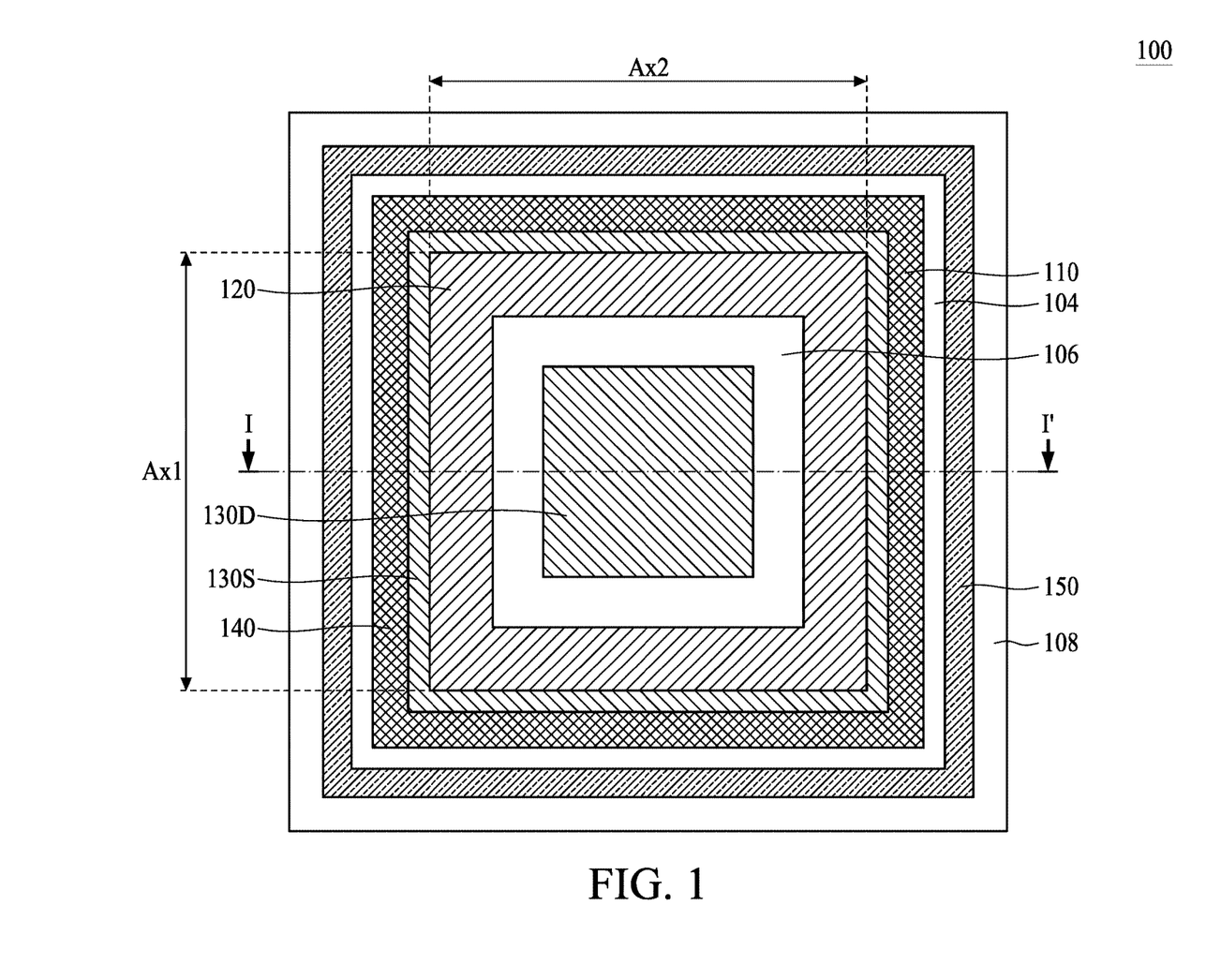
FIG. 1 is a top view of a high-voltage device according to aspects of the present disclosure in one or more embodiments.
Figure 2:
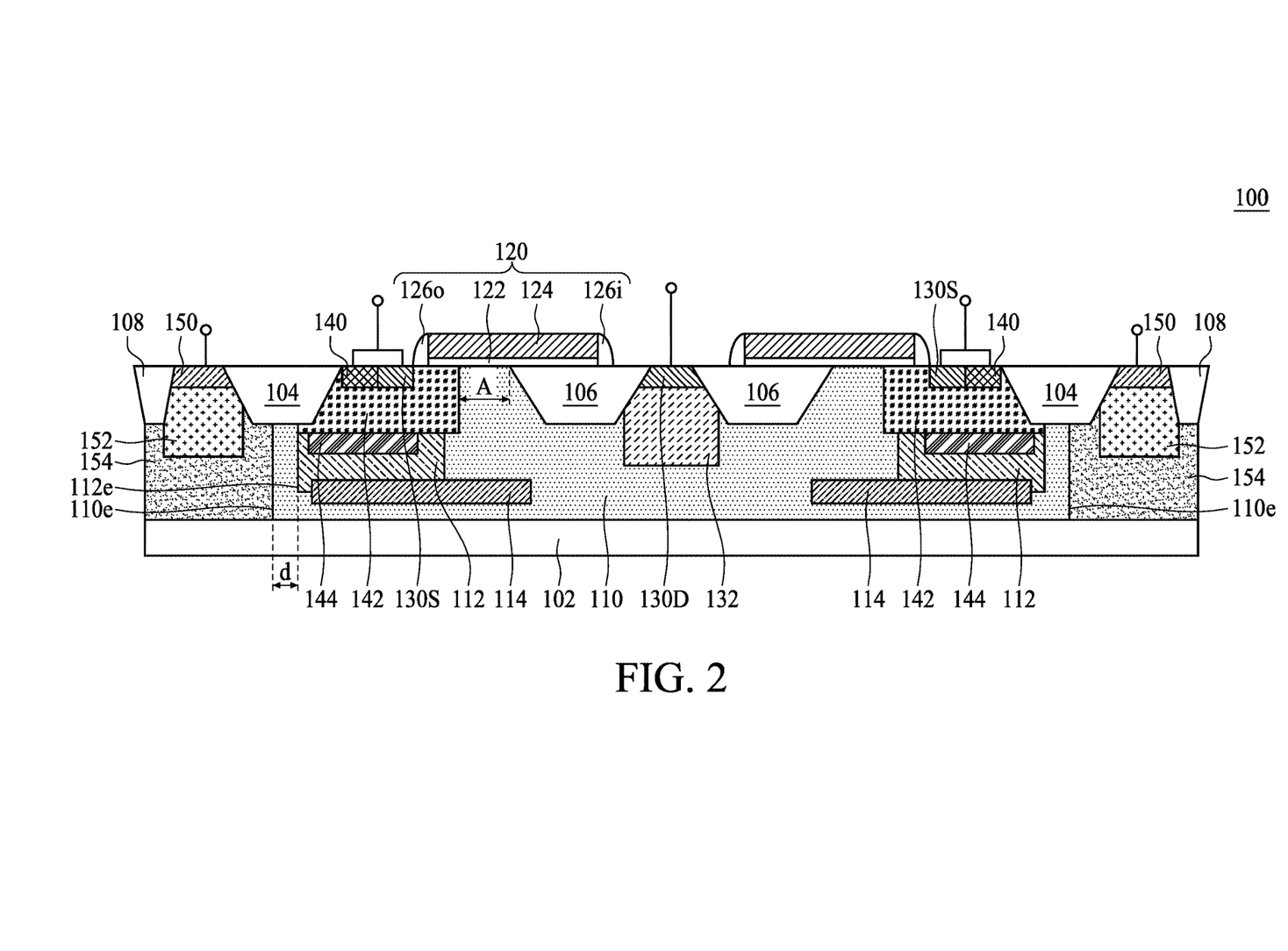
FIG. 2 is a cross-sectional view taken along line I-I' of FIG. 1.

Referring to FIGS. 1 and 2, FIG. 1 illustrates a top view of a high-voltage device 100, and FIG. 2 is a cross-sectional view taken along line I-I' of FIG. 1. In some embodiments, the high-voltage device 100 includes a substrate 102 (shown in FIG. 2). The substrate 102 can include an elementary semiconductor including silicon or (germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable material; or a combination thereof. In some embodiments, the alloy semiconductor substrate may a SiGe alloy with a gradient Ge feature in which the Si and Ge composition changes from one ratio at one location to another ratio at another location of the gradient SiGe feature. In another embodiment, the SiGe alloy is formed over a silicon substrate. In some embodiments, a SiGe alloy can be mechanically strained by another material in contact with the SiGe alloy. Furthermore, the substrate 102 may be a semiconductor on insulator, such as silicon on insulator (SOI). In some embodiments, the substrate 102 may include a doped epitaxial layer or a buried layer. In some embodiments, the substrate 102 may have a multilayer structure, or the substrate 102 may include a multilayer compound semiconductor structure.

The high-voltage device 100 includes a well region 110. In some embodiments, the well region 110 includes a first conductivity type, and the substrate 102 includes a second conductivity type. The first conductivity type and the second conductivity type are complementary to each other. In some embodiments, the first conductivity type is an n type, and the second conductivity type is a p type. In some embodiments, n-type dopants include arsenic (As), phosphorus (P), other group V elements, or any combination thereof. In some embodiments, p-type dopants include boron (B), other group III elements, or any combination thereof. Although the substrate 102 and the well region 110 include dopants of different types, a doping concentration of the well region 110 is greater than a doping concentration of the substrate 102. The well region 110 can be referred to as a drift region. In some embodiments, the well region 110 can be referred to as a high-voltage n-type well (HVNW).

In some embodiments, the high voltage device 100 includes an isolation 104, such as a frame-like isolation 104 disposed in the substrate 102. In some embodiments, the isolation 104 can be a shallow trench isolation (STI), as shown in FIG. 2. In other embodiments, the isolation 104 includes a structure of a local oxidization of silicon (LOCOS) structure, or any other suitable isolation structure. As shown in FIGS. 1 and 2, a bottom of the well region 110 is in contact with the substrate 102, and side edges 110e of the well region 110 are under the frame-like isolation 104. In some embodiments, the frame-like isolation 104 can be said to surround the well region 110. As shown in FIG. 2, the isolation 104 is partially disposed in the well region 110.

In some embodiments, the high-voltage device 100 includes another isolation 106, for example, a frame-like isolation 106. As mentioned above, the isolation 106 can be an STI, a LOCOS structure, or any other suitable isolation structure. A width of the isolation 104 and a width of the isolation 106 can be similar or different, depending on different product designs. A depth of the isolation 104 and a depth of the isolation 106 are similar. As shown in FIG. 2, the isolation 106 is disposed in well region 110, and a bottom surface and side edges of the isolation 106 are in contact with the well region 110.

The high-voltage device 100 further includes a well region 112 disposed in the well region 110. The well region 112 can be a frame-like well region 112 disposed between the isolation 104 and the isolation 106, as shown in FIG. 2. In some embodiments, at least a portion of side edges of the well region 112 is in contact with the well region 110, and a portion of a bottom of the well region 112 is in contact with the well region 110. The well region 112 can include the second conductivity type. In some embodiments, the well region 112 can be referred to as a high-voltage p-type well (HVPW). In some embodiments, the well region 112 is separated from the substrate 102 by the well region 110.

The high-voltage device 100 further includes a well region 114. The well region 114 is partially disposed in the well region 110 and partially in the well region 112, as shown in FIG. 2. In some embodiments, a bottom surface of the well region 114 is lower than a bottom surface of the well region 112, and thus the well region 114 can be referred to as a deep p-type well (DPW). As shown in FIG. 2, the bottom surface of the well region 114 is in contact with the well region 110. The well region 114 can include the second conductivity type. In some embodiments, a doping concentration of the well region 114 is greater than a doping concentration of the well region 112.

The high-voltage device 100 includes a frame-like gate structure 120 disposed on the substrate 102. As shown in FIGS. 1 and 2, the frame-like gate structure 120 covers a portion of the isolation 106 and a portion of the well region 110. However, the frame-like gate structure 120 is separated from the isolation 104. Further, the frame-like gate structure 120 may be surrounded by the well region 112. In some embodiments, a channel is formed in the well region 110 directly under the frame-like gate structure 120. The frame-like gate structure 120 includes a first axis Ax1 and a second axis Ax2, wherein the first axis Ax1 is perpendicular to the second axis Ax2. In some embodiments, a length of the first axis Ax1 and a length of the second axis Ax2 are similar, such that the frame-like gate structure 120 has a point symmetry configuration and a line symmetry configuration, but the disclosure is not limited thereto.

In some embodiments, the frame-like gate structure 120 includes a gate conductive layer 122 and a gate dielectric layer 124 between the gate conductive layer 122 and the substrate 102. The gate conductive layer 122 can include polysilicon, silicon-germanium, and at least one metallic material including elements and compounds such as Mo, Cu, W, Ti, Ta, TiN, TaN, NiSi, CoSi, or other suitable conductive materials known in the art. In some embodiments, the gate conductive layer 122 includes a work function metal layer that provides a metal gate with an n-type-metal work function or p-type-metal work function. The p-type-metal work function materials include materials such as ruthenium, palladium, platinum, cobalt, nickel, conductive metal oxide, or other suitable materials. The n-type-metal work function materials include materials such as hafnium zirconium, titanium, tantalum, aluminum, metal carbides (e.g., hafnium carbide, zirconium carbide, titanium carbide, and aluminum carbide), aluminides, or other suitable materials.

The gate dielectric layer 124 can have a single layer or a multi-layer structure. In some embodiments, the gate dielectric layer 124 is a multi-layer structure that includes an interfacial layer and a high-k dielectric layer. The interfacial layer can include dielectric material such as silicon oxide, silicon nitride, silicon oxynitride, other dielectric material, or a combinations thereof. The high-k dielectric layer can include high-k dielectric material such as $HfO_2$, HiSiO, HfSiON, HfTaO, HfTiO, HfZrO, other suitable high-k dielectric materials, or a combinations thereof. In some embodiments, the high-k dielectric material can further be selected from metal oxides, metal nitrides, metal silicates, transition metal-oxides, transition metal-nitrides, transition-metal silicates, metal oxynitrides, metal aluminates, and combinations thereof.

In some embodiments, the frame-like gate structure 120 may include spacers 126$i$ and 126$o$ disposed over sidewalls. In some embodiments, the frame-like gate structure 120 includes an inner spacer 126$i$ disposed over an inner sidewall of the frame-like gate structure 120, and an outer spacer 126$o$ disposed over an outer sidewall of the frame-like gate structure 120. As shown in FIG. 2, the inner spacer 126$i$ may be disposed over the isolation 106, while the outer spacer 126$o$ is disposed over the substrate 120. It should be noted that the inner spacer 126$i$ and the outer spacer 126$o$ are omitted from FIG. 1 for clarity; however, those skilled in the art should easily realize locations of the inner and outer spacers 126$i$ and 126$o$ according to FIG. 2.

Still referring to FIGS. 1 and 2, the high-voltage device 100 includes a drain region 130D and a doped region 132 disposed in the well region 110. Further, the drain region 130D and the doped region 132 are enclosed by the frame-like isolation 106. In other words, the drain region 130D and the doped region 132 are disposed in a central region within the frame-like isolation 106 and the frame-like gate structure 120, as shown in FIG. 1. The drain region 130D and the doped region 132 are separated from the frame-like gate structure 120 by the frame-like isolation 106, as shown in FIG. 2. The doped region 132 is disposed under the drain region 130D. Further, the doped region 132 is separated from the substrate 102 by the well region 110. In some embodiments, side edges of the drain region 130D are in contact with the isolation 106, and a bottom surface of the drain region 130D is in contact with the doped region 132. The drain region 130D and the doped region 132 include the first conductivity type. A doping concentration of the drain region 130D is greater than a doping concentration of the doped region 132.

The high-voltage device 100 includes a source region 130S in the substrate 102 and adjacent to the frame-like gate structure 120 on a side opposite to the drain region 130D. The source region 130S is therefore separated from the drain region 130D by the frame-like gate structure 120 and the frame-like isolation 106. The source region 130S includes the first conductivity type, and a doping concentration of the source region 130S is similar to the doping concentration of the drain region 130D. In some embodiments, the source region 130S disposed between the frame-like gate structure 120 and the isolation 104 has a frame-like configuration surrounding the frame-like gate structure 120, as shown in FIG. 1.

In some embodiments, the high-voltage device 100 further includes a doped region 140. The doped region 140 is adjacent to the source region 130S. The doped region 140 includes the second conductivity type. In some embodiments, the doped region 140 has a frame-like configuration surrounding the frame-like source region 130S, as shown in FIG. 1. In some embodiments, the doped region 140 serves as a body pickup region. A person skilled in the art will recognize that there may be many alternatives, modifications and variations. For example, depending on different applications and design needs, the body pickup region 140 and the source region 130S may share a contact plug.

Additionally, a silicide structure (not shown) can be formed on the drain region 130D, the source region 130S and the doped region 140. The silicide structure may include materials such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridum silicide (IrSi), erbium silicide (ErSi), cobalt silicide (CoSi), other suitable materials, or a combination thereof.

The high-voltage device 100 further includes a doped region 142 disposed in the well region 110. In some embodiments, the doped region 142 also has a frame-like configuration surrounding the frame-like gate structure 120. However, because the doped region 142 is partially covered by the frame-like gate structure 120, partially covered by the source region 130S and the doped region 140, and partially covered by the isolation 104, the doped region 142 may not be observed from the top view. The doped region 142 includes the second conductivity type. Further, a doping concentration of the doped region 142 is less than a doping concentration of the doped region 140. In some embodiments, the doping concentration of the doped region 142 may between approximately $2.5E+15/cm^3$ and approximately $3.5E+18/cm^3$, but the disclosure is not limited thereto. In some embodiments, the doped region 142 can be referred to as a high-voltage p-type body (HVPB). In some embodiments, a side edge of the doped region 142 can be in contact with the well region 110.

The high-voltage device 100 further includes another doped region 144 under the doped region 142, and separated from the well region 110 by the well region 112. In some embodiments, the doped region 144 also has a frame-like configuration surrounding the frame-like gate structure 120.

The doped region 144 includes the second conductivity type. Further, the doping concentration of the doped region 142 is greater than a doping concentration of the doped region 144. In some embodiments, a top surface of the doped region 144 is in contact with the doped region 142, and side edges and a bottom surface of the doped region 144 are in contact with the well region 112.

In some embodiments, the high-voltage device 100 includes another isolation 108, such as a frame-like isolation 108 surrounding the isolation 104, the well regions 110, 112 and 114, the doped regions 140, 142 and 144, the source region 130S, the frame-like gate structure 120 and the drain region 130D.

In some embodiments, a doped region 150 is formed between the isolation 104 and the isolation 108. Further, a doped region 152 and a well region 154 may be formed under the doped region 150. The doped region 150, the doped region 152 and the well region 154 include the second conductivity type. A doping concentration of the doped region 150 is greater than a doping concentration of the doped region 152, and the doping concentration of the doped region 152 is greater than a doping concentration of the well region 154. In some embodiments, the doped region 152 is disposed under the doped region 150 such that a bottom surface of the doped region 150 is in contact with the doped region 152. The well region 154 is formed under the doped region 152, such that a bottom surface and side edges of the doped region 152 are in contact with the well region 154. In some embodiments, the well region 154 is in contact with the well region 110.

In some embodiments, the doped region 150 may serve as a guard ring for the high-voltage device 100. The doped region 150 allows an electrical bias to be applied to the substrate 102 through the doped region 152 and the well region 154. It should be understood that the formation of the doped region 150 is optional.

According to some embodiments of the high-voltage device 100, an edge 112e of the well region 112 is in contact with the well region 110. Further, a distance d can be defined between the edge 112e of the well region 112 and the edge 110e of the well region 110, as shown in FIG. 2. In some embodiments, the distance d can be between approximately 2 μm and approximately 3 μm. In some comparative approaches, when the distance d between the edge 112e and the edge 110e is less than 2 μm, current may punch through the well region 110, and thus such device may fail. In alternative comparative approaches, when the distance d between the edge 112e and the edge 110e is greater than 3 μm, such device may need more area to accommodate the well region and thus cannot be shrunk. In contrast to the comparative approaches, an anti-punch capability of the high-voltage device 100 can be improved by greater than approximately 300%.

It should be noted that a drain-to-source breakdown voltage is the voltage below which the respective device (such as the high-voltage device 100) may operate. When a voltage greater than the breakdown voltage is applied, catastrophic and irreversible damage is caused to the device, rendering the device commercially useless and requiring the device to be replaced. Accordingly, increasing the breakdown voltage is highly desirable. In the high-voltage device 100, the gate structure 120 has the frame-like configuration. Accordingly, the well region 110 under the frame-like gate structure 120 can be fully depleted when the high-voltage device 100 is in an off state. In other words, a frame-like fully depleted region A may be formed when the high voltage device 100 is in off state. The frame-like fully-depleted region A helps to increase the breakdown voltage. In some embodiments, the breakdown voltage of the high-voltage device 100 can be improved by greater than approximately 27%. Because a channel width of the frame-like gate structure 120 is increased by the point symmetry configuration and the line symmetry configuration, an on-resistance of the high-voltage device 100 can be reduced.

Additionally, the high-voltage device 100 has a point symmetry configuration and a line symmetry configuration, but the disclosure is not limited thereto.

Figure 3:
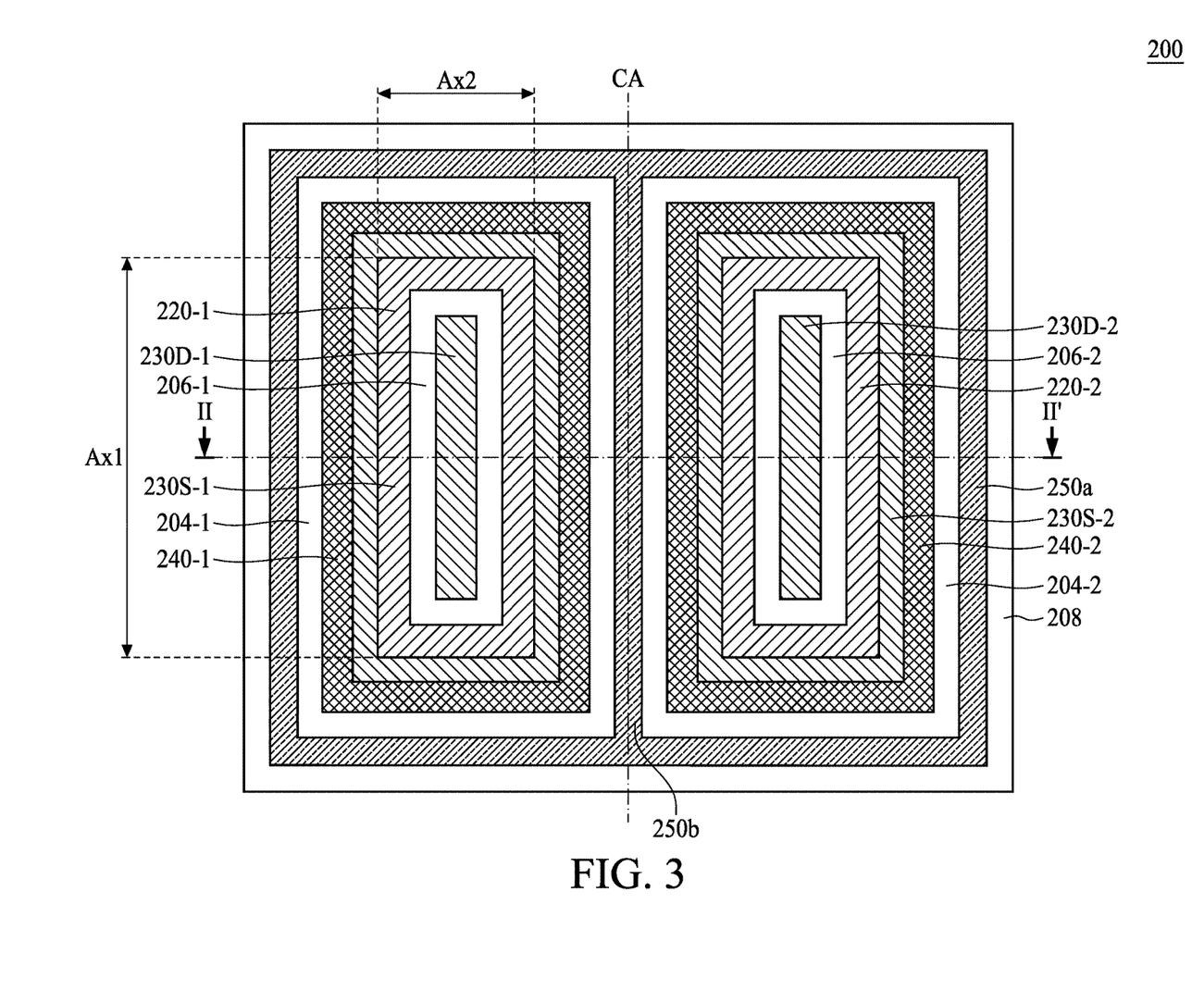
FIG. 3 is a top view of a high-voltage device according to aspects of the present disclosure in one or more embodiments.
Figure 4:
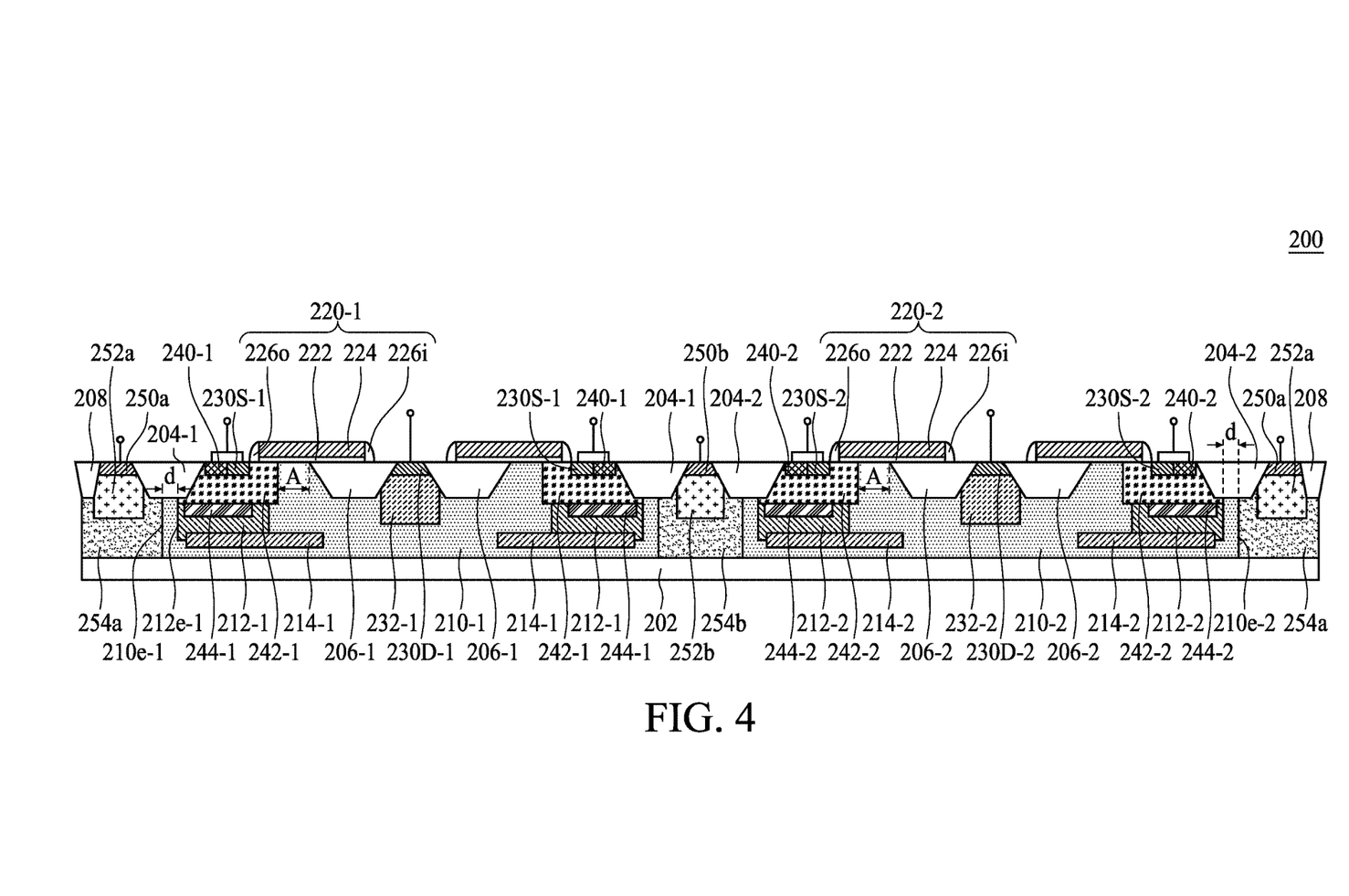
FIG. 4 is a cross-sectional view taken along line II-II' of FIG. 3.

Referring to FIGS. 3 and 4, FIG. 3 illustrates a top view of a high voltage device 200, and FIG. 4 is a cross-sectional view taken along line II-II' of FIG. 3. It should be noted that details, such as materials, of same elements shown in FIGS. 1 and 3 and FIGS. 2 and 4 are omitted for brevity. In some embodiments, the high-voltage device 200 includes a substrate 202 (shown in FIG. 4). The high-voltage device 200 includes well regions 210-1 and 210-2. In some embodiments, the well regions 210-1 and 210-2 include a first conductivity type, and the substrate 202 includes a second conductivity type. The first conductivity type and the second conductivity type are complementary to each other. In some embodiments, the first conductivity type is an n type, and the second conductivity type is a p type. Although the substrate 202 and the well regions 210-1, 210-2 include dopants of different types, a doping concentration of the well regions 210-1 and 210-2 is greater than a doping concentration of the substrate 202. Further, the doping concentration of the well region 210-1 and the doping concentration of the well region 210-2 are the same. The well regions 210-1 and 210-2 can be referred to as a drift region. In some embodiments, the well regions 210-1 and 210-2 can be referred to as a high-voltage n-type well (HVNW).

In some embodiments, the high-voltage device 200 includes a frame-like isolation 204-1 and a frame-like isolation 204-2 disposed in the substrate 202. As shown in FIGS. 3 and 4, the frame-like isolation 204-1 and the frame-like isolation 204-2 are separated from each other. In some embodiments, the frame-like isolations 204-1 and 204-2 can be STI, as shown in FIG. 4. In other embodiments, the frame-like isolation 204-1 and the frame-like isolation 204-2 include a structure of a LOCOS structure, or any other suitable isolation structure. A width and a depth of the frame-like isolation 204-1 are similar to a width and a depth of the frame-like isolation 204-2. As shown in FIGS. 3 and 4, bottoms of the well regions 210-1 and 210-2 are in contact with the substrate 202. Side edges 210e-1 of the well region 210-1 are under the frame-like isolation 204-1, and side edges 210e-2 of the well region 210-2 are under the frame-like isolation 204-2. In some embodiments, the frame-like isolation 204-1 can be said to surround the well region 210-1, and the frame-like isolation 204-2 can be said to surround the well region 210-2. As shown in FIG. 4, the frame-like isolation 204-1 is partially disposed in the well region 210-1, and the frame-like isolation 204-2 is partially disposed in the well region 210-2.

In some embodiments, the high-voltage device 200 includes a frame-like isolation 206-1 and a frame-like isolation 206-2 separated from each other. As mentioned above, the frame-like isolations 206-1 and 206-2 can be an STI, a LOCOS structure, or any other suitable isolation structure. A width of the frame-like isolations 204-1, 204-2 and a width of the frame-like isolations 206-1, 206-2 can be similar or different, depending on different product designs. A depth of the frame-like isolations 204-1, 204-2 and a depth of the frame-like isolations 206-1, 206-2 are similar. The frame-like isolation 206-1 is disposed in the well region 210-1, and the frame-like isolation 206-2 is disposed in the well region 210-2. As shown in FIG. 4, a bottom surface and side edges of the frame-like isolation 206-1 are in contact with the well region 210-1, and a bottom surface and side edges of the frame-like isolation 206-2 are in contact with the well region 210-2.

The high-voltage device 200 further includes a frame-like well region 212-1 disposed in the well region 210-1, and a frame-like well region 212-2 in the well region 210-2. The frame-like well region 212-1 is disposed between the frame-like isolation 204-1 and the frame-like isolation 206-1, while the frame-like well region 212-2 is disposed between the frame-like isolation 204-2 and the frame-like isolation 206-2, as shown in FIG. 4. In some embodiments, at least a portion of side edges of the frame-like well region 212-1 is in contact with the well region 210-1, and a portion of a bottom of the frame-like well region 212-1 is in contact with the well region 210-1. Similarly, at least a portion of side edges of the frame-like well region 212-2 is in contact with the well region 210-2, and a portion of a bottom of the frame-like well region 212-2 is in contact with the well region 210-2. The frame-like well regions 212-1 and 212-2 can include the second conductivity type. A doping concentration of the frame-like well region 212-1 and a doping concentration of the frame-like well region 212-2 are the same. In some embodiments, the frame-like well regions 212-1 and 212-2 can be referred to as high-voltage p-type wells (HVPW). Further, the frame-like well regions 212-1 and 212-2 are separated from each other.

The high-voltage device 200 further includes frame-like well regions 214-1 and 214-2 separated from each other. The frame-like well region 214-1 is partially disposed in the well region 210-1 and partially in the frame-like well region 212-1, and the frame-like well region 214-2 is partially disposed in the well region 210-2 and partially in the frame-like well region 212-2, as shown in FIG. 4. In some embodiments, a bottom surface of the frame-like well region 214-1 is lower than a bottom surface of the frame-like well region 212-1; therefore, a bottom surface of the frame-like well region 214-1 is in contact with the well region 210-1. Similarly, a bottom surface of the frame-like well region 214-2 is in contact with the well region 210-2. Thus, the frame-like well regions 214-1 and 214-2 can be referred to as deep p-type wells (DPW). The frame-like well regions 214-1 and 214-2 can include the second conductivity type. In some embodiments, a doping concentration of the frame-like well regions 214-1 and 214-2 is greater than a doping concentration of the frame-like well regions 212-1 and 212-2. Further, the doping concentration of the frame-like well region 214-1 and the doping concentration of the frame-like well region 214-2 are the same.

The high-voltage device 200 includes frame-like gate structures 220-1 and 220-2 separated from each other. As shown in FIGS. 3 and 4, the frame-like gate structure 220-1 covers a portion of the frame-like isolation 206-1 and a portion of the well region 210-1, and the frame-like gate structure 220-2 covers a portion of the frame-like isolation 206-2 and a portion of the well region 210-2. The frame-like gate structure 220-1 is separated from the frame-like isolation 204-1, and the frame-like gate structure 220-2 is separated from the frame-like isolation 204-2, Further, the frame-like gate structure 220-1 may be surrounded by the frame-like well region 212-1, and the frame-like gate structure 220-2 may be surrounded by the frame-like well region 212-2. The frame-like gate structures 220-1 and 220-2 respectively include a first axis Ax1 and a second axis Ax2, and the first axis Ax1 is perpendicular to the second axis Ax2. In some embodiments, a length of the first axis Ax1 is greater than a length of the second axis Ax2, as shown in FIG. 3.

In some embodiments, the frame-like gate structures 220-1 and 220-2 respectively include a gate conductive layer 222 and a gate dielectric layer 224 between the gate conductive layer 222 and the substrate 202. The gate dielectric layer 224 can have a single layer or a multi-layer structure. In some embodiments, the gate dielectric layer 224 is a multi-layer structure that includes an interfacial layer and a high-k dielectric layer. In some embodiments, each of the frame-like gate structures 220-1 and 220-2 may include spacers 226$i$ and 226$o$ disposed over sidewalls. In some embodiments, each of the frame-like gate structures 220-1 and 220-2 includes an inner spacer 226$i$ disposed over an inner sidewall and an outer spacer 226$o$ disposed over an outer sidewall. As shown in FIG. 4, the inner spacer 226$i$ may be disposed over the frame-like isolation 206-1 or 206-2, while the outer spacer 226$o$ is disposed over the substrate 202. Additionally, it should be noted that the inner spacer 226$i$ and the outer spacer 226$o$ are omitted from FIG. 3 for clarity, however, those skilled in the art should easily realize locations of the inner and outer spacers 226$i$ and 226$o$ according to FIG. 4.

Still referring to FIGS. 3 and 4, the high-voltage device 200 includes a drain region 230D-1 and a doped region 232-1 disposed in the well region 2104, and a drain region 230D-2 and a doped region 232-2 disposed in the well region 210-2. Further, the drain region 230D-1 and the doped region 232-1 are enclosed by the frame-like isolation 206-1, and the drain region 230D-2 and the doped region 232-2 are enclosed by the frame-like isolation 206-2. In other words, the drain region 230D-1 and the doped region 232-1 are disposed in a central region within the frame-like isolation 206-1 and the frame-like gate structure 220-1, while the drain region 230D-2 and the doped region 232-2 are disposed in a central region within the frame-like isolation 206-2 and the frame-like gate structure 220-2, as shown in FIG. 3. The drain region 230D-1 and the doped region 232-1 are separated from the frame-like gate structure 220-1 by the frame-like isolation 206-1, and the drain region 230D-2 and the doped region 232-2 are separated from the frame-like gate structure 220-2 by the frame-like isolation 206-2, as shown in FIG. 4. The doped regions 232-1 and 232-2 are disposed under the drain regions 230D-1 and 230D-2. Further, the doped region 232-1 is separated from the substrate 202 by the well region 210-1, and the doped region 232-2 is separated from the substrate 202 by the well region 210-2. In some embodiments, side edges of the drain region 230D-1 are in contact with the frame-like isolation 206-1, and a bottom surface of the drain region 230D-1 is in contact with the doped region 232-1. Similarly, side edges of the drain region 230D-2 are in contact with the frame-like isolation 206-2, and a bottom surface of the drain region 230D-2 is in contact with the doped region 232-2. The drain regions 230D-1, 230D-2 and the doped regions 232-1, 232-2 include the first conductivity type. A doping concentration of the drain regions 230D-1, 230D-2 is greater than a doping concentration of the doped regions 232-1, 232-2.

The high-voltage device 200 includes a frame-like source region 230S-1 in the substrate 202 and adjacent to the frame-like gate structure 220-1 on a side opposite to the drain region 230D-1, and a frame-like source region 230S-2 in the substrate 202 and adjacent to the frame-like gate structure 220-2 on a side opposite to the drain region 230D-2. The frame-like source region 230S-1 is therefore separated from the drain region 230D-1 by the frame-like gate structure 220-1 and the frame-like isolation 206-1. Similarly, the frame-like source region 230S-2 is therefore separated from the drain region 230D-2 by the frame-like gate structure 220-2 and the frame-like isolation 206-2. The frame-like source regions 230S-1 and 230S-2 include the first conductivity type, and a doping concentration of the frame-like source regions 230S-1 and 230S-2 is similar to the doping concentration of the drain regions 230D-1 and 230D-2. Further, the frame-like source region 230S-1 is disposed between the frame-like gate structure 220-1 and the frame-like isolation 204-1 and surrounds the frame-like gate structure 220-1, while the frame-like source region 230S-1 is disposed between the frame-like gate structure 220-2 and the frame-like isolation 204-2 and surrounds the frame-like gate structure 220-2.

In some embodiments, the high-voltage device 200 further includes a frame-like doped region 240-1 adjacent to the frame-like source region 230S-1, and a frame-like doped region 240-2 adjacent to the frame-like source region 230S-2. The frame-like doped regions 240-1 and 240-2 include the second conductivity type. In some embodiments, the frame-like doped regions 240-1 and 204-2 serve as body pickup regions. A person skilled in the art will recognize there may be many alternatives, modifications and variations. For example, depending on different applications and design needs, the frame-like body pickup region 240-1 and the frame-like source region 230S-1 may share a contact plug, and the frame-like body pickup region 240-2 and the frame-like source region 230S-2 may share a contact plug.

As mentioned above, a silicide structure (not shown) can be formed on the drain regions 230D-1 and 230D-2, the frame-like source regions 230S-1 and 230S-2, and the frame-like doped regions 240-1 and 240-2.

The high-voltage device 200 further includes a frame-like doped region 242-1 disposed in the well region 210-1, and a frame-like doped region 242-2 in the well region 210-2. The frame-like doped region 242-1 is partially covered by the frame-like gate structure 220-1, partially covered by the frame-like source region 230S-1 and the frame-like doped region 240-1, and partially covered by the frame-like isolation 204-1; therefore, the frame-like doped region 242-1 may not be observed from the top view. Similarly, the frame-like doped region 242-2 is partially covered by the frame-like gate structure 220-2, partially covered by the frame-like source region 230S-2 and the frame-like doped region 240-2, and partially covered by the frame-like isolation 204-2; therefore, the frame-like doped region 242-2 may not be observed from the top view. The frame-like doped regions 242-1 and 242-2 include the second conductivity type. A doping concentration of the frame-like doped region 242-1 and a doping concentration of the frame-like doped region 242-2 are the same. Further, the doping concentrations of the frame-like doped regions 242-1 and 242-2 are less than doping concentrations of the frame-like doped regions 240-1 and 240-2, in some embodiments, the frame-like doped regions 242-1 and 242-2 can be referred to as a high-voltage p-type body (HVPB). In some embodiments, a side edge of the frame-like doped region 242-1 can be in contact with the well region 2104, and a side edge of the frame-like doped region 242-2 can be in contact with the well region 210-2.

The high-voltage device 200 further includes another frame-like doped region 244-1 under the frame-like doped region 242-1 and separated from the well region 210-1 by the frame-like well region 212-1, and a frame-like doped region 244-2 under the frame-like doped region 242-2 and separated from the well region 210-2 by the frame-like well region 212-2. The frame-like doped region 244-1 surrounds the frame-like gate structure 220-1, and the frame-like doped region 244-2 surrounds the frame-like gate structure 220-2. The frame-like doped regions 244-1 and 244-2 include the second conductivity type. A doping concentration of the frame-like doped region 244-1 and a doping concentration of the frame-like doped region 244-2 are the same. Further, the doping concentrations of the doped regions 242-1 and 242-2 are greater than the doping concentrations of the doped regions 244-1 and 244-2. In some embodiments, a top surface of the frame-like doped region 244-1 is in contact with the frame-like doped region 242-1, and side edges and a bottom surface of the frame-like doped region 244-1 are in contact with the frame-like well region 212-1. Similarly, a top surface of the frame-like doped region 244-2 is in contact with the frame-like doped region 242-2, and side edges and a bottom surface of the frame-like doped region 244-2 are in contact with the frame-like well region 212-2.

In some embodiments, the high-voltage device 200 includes another frame-like isolation 208 surrounding the isolations 204-1 and 204-2, the well regions 210-1 and 210-2, the frame-like well regions 212-1, 212-2, 214-1 and 214-2, the frame-like doped regions 240-1, 240-2, 242-1, 242-2, 244-1 and 244-2, the frame-like source regions 230S-1 and 230S-2, the frame-like gate structures 220-1 and 220-2, and the drain regions 230D-1 and 230D-2.

In some embodiments, a frame-like doped region 250a is disposed between the frame-like isolation 204-1 and the frame-like isolation 208. Further, a doped region 250b is disposed between the frame-like isolation 204-1 and the frame-like isolation 204-2. The frame-like doped region 250a and the doped region 250b are coupled. The high-voltage device 200 further includes a frame-like doped region 252a and a frame-like well region 254a under the frame-like doped region 250a, and a doped region 252b and a well region 254b under the doped region 250b. The doped region 252b is coupled to the frame-like doped region 252a, and the well region 254b is coupled to the frame-like well region 254a.

The frame-like doped region 250a, the doped region 250b, the frame-like doped region 252a, the doped region 252b, the frame-like well region 254a and the well region 254b include the second conductivity type. A doping concentration of the frame-like doped region 250a and a doping concentration of the doped region 250b are the same, a doping concentration of the frame-like doped region 252a and a doping concentration of the doped region 252b are the same, and a doping concentration of the frame-like well region 254a and a doping concentration of the well region 254b are the same. Further, the doping concentrations of the frame-like doped region 250a and the doped region 250b are greater than the doping concentrations of the frame-like doped region 252a and the doped region 252b, and the doping concentrations of the frame-like doped region 252a and the doped region 252b are greater than the doping concentrations of the frame-like well region 254a and the well region 254b. In some embodiments, the frame-like doped region 252a is disposed under the frame-like doped region 250a such that a bottom surface of the frame-like doped region 250a is in contact with the frame-like doped region 252a. The frame-like well region 254a is formed under the frame-like doped region 252a, such that a bottom surface and side edges of the frame-like doped region 252a are in contact with the frame-like well region 254a. Similarly, the doped region 252b is disposed under the doped region 250b such that a bottom surface of the doped region 250b is in contact with the doped region 252b. The well region 254b is formed under the doped region 252b, such that a bottom surface and side edges of the doped region 252b are in contact with the well region 254b. In some embodiments, the frame-like well region 254a and the frame-like well region 254b are in contact with both of the well regions 210-1 and 210-2.

In some embodiments, the frame-like doped region 250a and the doped region 250b may serve as guard rings for the high-voltage device 200. The frame-like doped region 250a and the doped region 250b allow an electrical bias to be applied to the substrate 202 through the frame-like doped region 252a, the frame-like doped region 252b, the frame-like well region 254a and the frame-like well region 254. It should be understood that the formation of the frame-like doped region 250a and the frame-like doped region 250b is optional.

Additionally, the high-voltage device 200 has a line symmetry configuration about a central axis CA, as shown in FIG. 3. In some embodiments, the central axis CA pass through the doped region 250b. Accordingly, arrangements of elements to the left of the central axis CA (i.e., the drain region 230D-1, the doped region 232-1, the frame-like isolation 204-1, the frame-like gate structure 220-1, the frame-like source region 230S-1, the frame-like doped regions 240-1, 242-1, 244-1, the well region 210-1, and the frame-like well regions 212-1, 214-1) are identical to arrangements of elements to the right of the central axis CA (i.e., the drain region 230D-2, the doped region 232-2, the frame-like isolation 204-2, the frame-like gate structure 220-2, the frame-like source region 230S-2, the frame-like doped regions 240-2, 242-2, 244-2, the well region 210-2, and the frame-like well regions 212-2, 214-2). In some embodiments, the drain regions 230D-1 and 230D-2 are electrically connected to a same connecting structure, the frame-like gate structures 220-1 and 220-2 are electrically connected to a same connecting structure, and the frame-like source regions 230S-1 and 230S-2 are electrically connected to a same connecting structure.

According to some embodiments of the high-voltage device 200, a distance d can be defined between the edge 212e-1 of the well region 212-1 and the edge 210e-1 of the well region 210-1, and between an edge 212e-2 of the well region 212-2 and the edge 210e-2 of the well region 210-2, as shown in FIG. 4. In some embodiments, the distance d can be between approximately 2 μm and approximately 3 μm. In some comparative approaches, when the distance d is less than 2 μm, current may punch though the well regions 210-1, 210-2 and thus such device may fail. In alternative comparative approaches, when the distance d is greater than 3 μm, such device may need more area to accommodate the well region and thus cannot be shrunk. In contrast to the comparative approaches, an anti-punch capability of the high-voltage device 200 can be improved by greater than approximately 300%.

Further, in the high-voltage device 200, the well region 210-1 under the frame-like gate structure 220-1 and the well region 210-2 under the frame-like gate structure 220-2 can be fully depleted when the high-voltage device 200 is in an off state. In other words, frame-like fully depleted regions A may be formed when the high-voltage device 200 is in the off state. The frame-like fully-depleted region A helps to increase the breakdown voltage. In some embodiments, the breakdown voltage of the high-voltage device 200 can be improved by greater than approximately 27%.

Because a channel width is increased by the frame-like gate structures 220-1 and 220-2, an on-resistance of the high-voltage device 200 can be reduced.

The present disclosure therefore provides a high-voltage device having a frame-like gate structure. The frame-like gate structure helps to reduce current from the drain region through the drift region. Accordingly, breakdown voltage and anti-punch capability of the high-voltage device can be increased. Further, because the frame-like gate helps to improve the anti-punch capability, a width of the n-type doped layer can be reduced, such that on-resistance can be reduced. In other words, the high-voltage device including the frame-like gate structure has an increased breakdown voltage, an improved anti-punch capability, and reduced on-resistance.

According to one embodiment of the present disclosure, a high-voltage device is provided. The high-voltage device includes a first frame-like isolation solation, a second frame-like isolation, a first frame-like gate structure, a second frame-like gate structure, a first drain region, a second drain region, a first frame-like source region, a second frame-like source region, a first doped region, and a second doped region. The first frame-like isolation and the second frame-like isolation are separated from each other. The first frame-like gate structure covers a portion of the first frame-like isolation, and the second frame-like gate structure covers a portion of the second frame-like isolation. The first drain region is enclosed by the first frame-like isolation, and the second drain region is enclosed by the second frame-like isolation. The first frame-like source region surrounds the first frame-like gate structure, and the second frame-like source region surrounds the second frame-like gate structure. The first doped region surrounds the first frame-like gate structure and the second frame-like gate structure. The second doped region is disposed between the first frame-like gate structure and the second frame-like gate structure. The second doped region is coupled to the first doped region. The first drain region, the second drain region, the first frame-like source region, the second frame-like source region include a first conductivity type. The first doped region and the second doped region include a second conductivity type. The first conductivity type and the second conductivity type are complementary to each other.

According to one embodiment of the present disclosure, a high-voltage device is provided. The high-voltage device includes a first frame-like isolation, a second frame-like isolation, a first frame-like gate structure, a second frame-like gate structure, a first drain region, a second drain region, a first frame-like source region, a second frame-like source region, a first well region, a second well region, a first frame-like well region, and a second frame-like well region. The first frame-like isolation and the second frame-like isolation are separated from each other. The first frame-like gate structure covers a portion of the first frame-like isolation, and the second frame-like gate structure covers a portion of the second frame-like isolation. The first drain region is enclosed by the first frame-like isolation, and the second drain region is enclosed by the second frame-like isolation. The first frame-like source region surrounds the first frame-like gate structure, and the second frame-like source region surrounds the second frame-like gate structure. The first well and the second well region are separated from each other. The first frame-like well region is in the first well region, and the second frame-like well region is in the second well region. The first frame-like well region surrounds the first frame-like gate structure, and the second frame-like well region surrounds the second frame-like gate structure. The first drain region, the second drain region, the first frame-like source region, the second frame-like source region, the first well region and the second well region include a first conductivity type. The first frame-like well region and the second frame-like well region include a second conductivity type. The first conductivity type and the second frame-like well region are separated from each other.

According to one embodiment of the present disclosure, a high-voltage device is provided. The high-voltage device includes a first well region, a second well region, a first frame-like well region, a second frame-like well region, a first frame-like isolation, a second frame-like isolation, a first frame-like gate structure, a second frame-like gate structure, a first drain region, a second drain region, a first frame-like source region, and a second frame-like source region. The first frame-like well region is in the first well region, and the second frame-like well region is in the second well region. The first frame-like isolation is in the first well region, and the second frame-like isolation is in the second well region. The first frame-like gate structure is disposed over the first well region and covers a portion of the first frame-like isolation. The second frame-like gate structure is disposed over the second well region and covers a portion of the second frame-like isolation. The first drain region is disposed in the first well region and separated from the first frame-like gate structure by the first frame-like isolation. The second drain region is disposed in the second well region and separated from the second frame-like gate structure by the second frame-like isolation. The first frame-like source region is separated from the first drain region by the first frame-like isolation and the first frame-like gate structure. The second frame-like source region is separated from the second drain region by the second frame-like isolation and the second frame-like gate structure. The first well region, the second well region, the first drain region, the second drain region, the first frame-like source region, and the second frame-like source region include a first conductivity type. The first frame-like well region and the second frame-like well region include a second conductivity type. The first conductivity type and the second conductivity type are complementary to each other.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A high-voltage device comprising:
a first frame-like isolation and a second frame-like isolation separated from each other;
a first frame-like gate structure covering a portion of the first frame-like isolation and a second frame-like gate structure covering a portion of the second frame-like isolation;
a first drain region enclosed by the first frame-like isolation and a second drain region enclosed by the second frame-like isolation;
a first frame-like source region surrounding the first frame-like gate structure and a second frame-like source region surrounding the second frame-like gate structure;
a first doped region surrounding the first frame-like gate structure and the second frame-like gate structure; and
a second doped region between the first frame-like gate structure and the second frame-like gate structure, and coupled to the first doped region,
wherein the first drain region, the second drain region, the first frame-like source region and the second frame-like source region comprise a first conductivity type, and the first doped region and the second doped region comprise a second conductivity type complementary to the first conductivity type.

2. The high-voltage device of claim 1, wherein the first frame-like source region and the second frame-like source region are separated from each other.

3. The high-voltage device of claim 1, further comprising:
a first well region and a second well region comprising the first conductivity type; and
a first frame-like well region and a second frame-like well region comprising the second conductivity type,
wherein the first frame-like well region is in the first well region, and the second frame-like well region is in the second well region.

4. The high-voltage device of claim 3, wherein the first frame-like well region surrounds the first frame-like gate structure, the second frame-like well region surrounds the second frame-like gate structure, and first frame-like well region and the second frame-like well region are separated from each other.

5. The high-voltage device of claim 1, wherein each of the first frame-like gate structure and the second frame-like gate structure has a first central axis and a second central axis perpendicular to each other, and a length of the first central axis is greater than a length of the second central axis.

6. A high-voltage device comprising:
a first frame-like isolation and a second frame-like isolation separated from each other;
a first frame-like gate structure covering a portion of the first frame-like isolation and a second frame-like gate structure covering a portion of the second frame-like isolation;
a first drain region enclosed by the first frame-like isolation and a second drain region enclosed by the second frame-like isolation;
a first frame-like source region surrounding the first frame-like gate structure and a second frame-like source region surrounding the second frame-like gate structure;
a first well region and a second well region separated from each other; and
a first frame-like well region in the first well region and a second frame-like well region in the second well region, wherein the first frame-like surrounds the first frame-like gate structure, and the second frame-like well region surrounds the second frame-like gate structure,
wherein the first drain region, the second drain region, the first frame-like source region, the second frame-like source region, the first well region and the second well region comprise a first conductivity type, and the first frame-like well region and the second frame-like well region comprise a second conductivity type complementary to the first conductivity type.

7. The high-voltage device of claim 6, wherein the first frame-like source region and the second frame-like source region are separated from each other.

8. The high-voltage device of claim 6, further comprising:
a first doped region surrounding the first frame-like gate structure and the second frame-like gate structure; and
a second doped region between the first frame-like gate structure and the second frame-like gate structure, and coupled to the first doped region.

9. The high-voltage device of claim 8, wherein the first doped region and the second doped region comprise the second conductivity.

10. The high-voltage device of claim 6, wherein the first frame-like well region and the second frame-like well region are separated from each other.

11. The high-voltage device of claim 6, wherein each of the first frame-like gate structure and the second frame-like gate structure has a first central axis and a second central axis perpendicular to each other, and a length of the first central axis is greater than a length of the second central axis.

12. The high-voltage device of claim 6, further comprising:
a third frame-like isolation surrounding the first drain region, the first frame-like isolation, the first frame-like gate structure, the first frame-like source region, the first well region and the first frame-like well region; and
a fourth frame-like isolation surrounding the second drain region, the second frame-like isolation, the second frame-like gate structure, the second frame-like source region, the second well region and the second frame-like well region.

13. The high-voltage device of claim 12, wherein the third frame-like isolation and the fourth frame-like isolation are separated from each other.

14. The high-voltage device of claim 12, further comprising a fifth frame-like isolation surrounding the third frame-like isolation and the fourth frame-like isolation.

15. A high-voltage device comprising:
a first well region and a second well region;
a first frame-like well region in the first well region, and a second frame-like well region in the second well region;
a first frame-like isolation in the first well region, and a second frame-like isolation in the second well region;
a first frame-like gate structure over the first well region and covering a portion of the first frame-like first isolation, and a second frame-like gate structure over the second well region and covering a portion of the second frame-like first isolation;
a first drain region in the first well region and separated from the first frame-like gate structure by the first frame-like isolation, and a second drain region in the second well region and separated from the second frame-like gate structure by the second frame-like isolation; and
a first frame-like source region separated from the first drain region by the first frame-like isolation and the first frame-like gate structure, and a second frame-like source region separated from the second drain region by the second frame-like isolation and the first frame-like gate structure,
wherein the first well region, the second well region, the first drain region, the second drain region, the first frame-like source region and the second frame-like source region comprise a first conductivity type, the first frame-like well region and the second frame-like well region comprise a second conductivity type, and the first conductivity type and the second conductivity type are complementary to each other.

16. The high-voltage device of claim 15, wherein the first frame-like source region and the second frame-like source region are separated from each other.

17. The high-voltage device of claim 15, wherein the first frame-like well region and the second frame-like well region are separated from each other.

18. The high-voltage device of claim 15, further comprising:
a third frame-like isolation surrounding the first drain region, the first frame-like isolation, the first frame-like gate structure, the first frame-like source region, the first well region and the first frame-like well region; and
a fourth frame-like isolation surrounding the second drain region, the second frame-like isolation, the second frame-like gate structure, the second frame-like source region, the second well region and the second frame-like well region.

19. The high-voltage device of claim 18, wherein the third frame-like isolation and the fourth frame-like isolation are separated from each other.

20. The high-voltage device of claim 18, further comprising a fifth frame-like isolation surrounding the third frame-like isolation and the fourth frame-like isolation.

* * * * *